United States Patent
Lu et al.

(10) Patent No.: US 11,959,945 B2
(45) Date of Patent: Apr. 16, 2024

(54) NANOSECONDS-PULSE BASED CURRENT/VOLTAGE MEASUREMENT FOR TESTING VERTICAL-CAVITY SURFACE-EMITTING LASER

(71) Applicant: NATIONAL INSTRUMENTS CORPORATION, Austin, TX (US)

(72) Inventors: Jun Lu, Cedar Park, TX (US); John George Banaska, Spicewood, TX (US); Matthew Tate Dougan, Austin, TX (US); Jeffrey Allan Cornell, Austin, TX (US); Wendi Song, Shanghai (CN); Xuechen Han, Shanghai (CN); Kunal Harsad Patel, Cedar Park, TX (US)

(73) Assignee: National Instruments Corporation, Austin, TX (US)

( * ) Notice: Subject to any disclaimer, the term of this patent is extended or adjusted under 35 U.S.C. 154(b) by 223 days.

(21) Appl. No.: 17/761,378

(22) PCT Filed: Nov. 26, 2020

(86) PCT No.: PCT/CN2020/131780
§ 371 (c)(1),
(2) Date: Mar. 17, 2022

(87) PCT Pub. No.: WO2022/109926
PCT Pub. Date: Jun. 2, 2022

(65) Prior Publication Data
US 2023/0152355 A1    May 18, 2023

(51) Int. Cl.
*G01R 19/03*    (2006.01)
*G01R 19/00*    (2006.01)
*H01S 5/183*    (2006.01)

(52) U.S. Cl.
CPC ............ *G01R 19/003* (2013.01); *H01S 5/183* (2013.01)

(58) Field of Classification Search
CPC ........ G01R 19/003; G01R 31/00; H01S 5/183
See application file for complete search history.

(56) References Cited

U.S. PATENT DOCUMENTS

2010/0121593 A1*  5/2010  McElfresh ......... G01R 31/2635
                                                   324/765.01
2017/0104450 A1   4/2017  Oh et al.
                          (Continued)

FOREIGN PATENT DOCUMENTS

CN      204807641 U    11/2015
CN      106463045 A     2/2017
                       (Continued)

OTHER PUBLICATIONS

International Search Report and Written Opinion; Application No. PCT/CN2020/131780; dated Aug. 20, 2021; 10 pgs.

*Primary Examiner* — Jermele M Hollington
*Assistant Examiner* — Taqi R Nasir
(74) *Attorney, Agent, or Firm* — Kowert, Hood, Munyon, Rankin & Goetzel P.C.; Jeffrey C. Hood

(57) ABSTRACT

Embodiments are presented herein of an open-loop test system for testing vertical-cavity surface-emitting lasers (VCSELs). A high-speed pulse generator may be used to produce nanoseconds pulses provided to the VCSEL device. A high-speed oscilloscope may be used to measure the resultant nanoseconds pulses across the VCSEL device. The VCSEL device voltage and VCSEL device current may be obtained from the measured nanosecond pulses according to compensation data derived from the system. A pre-test compensation procedure may be used to obtain the compensation data, which may include representative characteristics of each system component. The compensation procedure may also include capturing specified pulse trains under different load conditions of the pulse generator to obtain a scaling relationship between the VCSEL device current and (Continued)

an input voltage used for the pulse generation, and also for obtaining various parameters later used to derive an accurate VCSEL device voltage and an accurate VCSEL device current.

20 Claims, 11 Drawing Sheets

(56) References Cited

U.S. PATENT DOCUMENTS

2018/0003762 A1* 1/2018 Burlak ............... G01R 31/2874
2020/0153195 A1* 5/2020 Kupcho ............... H01S 5/0014

FOREIGN PATENT DOCUMENTS

| | | |
|---|---|---|
| CN | 107576852 A | 1/2018 |
| CN | 108303589 A | 7/2018 |
| CN | 109638643 A | 4/2019 |
| CN | 109713564 A | 5/2019 |
| JP | 2006229063 A | 8/2006 |

* cited by examiner

Step 1

Step 2

Step 3

NANOSECONDS-PULSE BASED CURRENT/VOLTAGE MEASUREMENT FOR TESTING VERTICAL-CAVITY SURFACE-EMITTING LASER

PRIORITY CLAIM

This application is a U.S. National Stage application of International Application No. PCT/CN2020/131780, filed Nov. 26, 2020, titled "Nanoseconds-Pulse Based Current/Voltage Measurement for Testing Vertical-Cavity Surface-Emitting Laser", which is hereby incorporated by reference in its entirety.

BACKGROUND OF THE INVENTION

Field of the Invention

This invention relates to measurement and data acquisition systems, including a system and method for testing a vertical-cavity surface-emitting laser (VCSEL) with a nanoseconds electric pulse.

Description of the Related Art

Measurement systems are oftentimes used to perform a variety of functions, including measurement of physical phenomena, measurement of certain characteristics or operating parameters of a unit under test (UUT) or device under test (DUT), testing and analysis of physical phenomena, process monitoring and control, control of mechanical or electrical machinery, data logging, laboratory research, and analytical chemistry, to name a few examples.

An example of a device that may be tested by a measurement system is a vertical-cavity surface-emitting laser (VCSEL), a semiconductor-base laser diode used in computer mice, fiber optics, laser printers, and more recently, facial recognition applications. The operating characteristics of a VCSEL are commonly tested using a Light Intensity-Current-Voltage (LIV) sweep test. In an LIV test, current applied to the VCSEL is swept and the intensity of the resulting emitted light is measured using a photo detector. Traditional current sweeping and LIV measurement technologies are limited by bandwidth and proximity (e.g. cabling length) considerations. Therefore, improvements in the field are desired.

Other corresponding issues related to the prior art will become apparent to one skilled in the art after comparing such prior art with the present invention as described herein.

SUMMARY OF THE INVENTION

Embodiments are presented herein of a system and method to test vertical-cavity surface-emitting lasers (VCSELs). In contrast to prior closed-loop test configurations, various embodiments of a VCSEL test system disclosed herein feature an open-loop configuration and a compensation algorithm. In some aspects, a high-speed pulse generator may be used to produce nanosecond pulses and provide the nanosecond pulses to a VCSEL device under test (DUT). An appropriate measurement device, e.g. a high-speed scope may then be used to measure voltage pulses (or voltage) developed across the VCSEL DUT in response to the nanosecond pulses. The pulse current may be obtained by comparing pulse voltages under different load conditions. In some aspects, a compensation algorithm may be used to scale the pulse voltage at the pulse generator to the desired corresponding pulse current at the VCSEL device, and may be further used to compensate for the loss of signal caused by high-speed signals being transmitted over long cables. The compensation algorithm may further be used to correct system measurement errors by characterizing various system components and equipment, for example the pulse generator, the measurement device (e.g. high-speed oscilloscope), cables and other system elements.

Pursuant to the above, a system for testing a VCSEL device may include a high-speed pulse generator to produce a nanosecond pulse generated based at least on first compensation data derived from the system, and to provide the nanosecond pulse to the VCSEL device. The system may further include a high-speed measurement instrument to obtain a measured VCSEL device voltage-pulse generated by the VCSEL device responsive to the nanosecond pulse, and further to obtain a measured VCSEL device current-pulse based at least on the measured VCSEL device voltage-pulse and second compensation data derived from the system. In this manner, compensation data derived from the system may be used to adjust/set at least the amplitude of the nanosecond pulse generated by the pulse generator, and may further be used to obtain (or derive) a corresponding measured VCSEL DUT current-pulse from a measured voltage-pulse effected across the VCSEL DUT responsive to the stimulus nanosecond pulses.

In some aspects, a pre-test compensation procedure may be performed on the system to obtain various parameters corresponding to the compensation data. The compensation data is representative of various elements and/or components of the system, and may be used to adjust input signals and measured outputs of the system to obtain an accurate characterization or test result of the tested VCSEL device or DUT. The pre-test compensation procedure may include a system compensation procedure and a pulse compensation procedure. The system compensation procedure may include performing a series of operational steps to obtain representative characteristics of each system component. For example, the system compensation procedure may be used to obtain parameters of systems components including, but not limited to, output impedance of the pulse generator, pulse output cable loss, scope measurement cable loss, pulse output cable impedance, scope measurement cable impedance, scope measurement error correction factor, and/or scope input impedance.

The pulse compensation procedure may include capturing specified pulse trains under different load conditions and determining/obtaining a scaling relationship between the voltage-setting for a voltage used in the pulse generation, e.g. the voltage-setting of an SMU used to provide the input voltage based on which the current pulses are generated, and the current-setting of the VCSEL device (or DUT). Once the scaling relationship has been established/obtained, appropriate scaling coefficients may be used to set up the pulse generation, e.g. to set up the SMU, and generate high-speed current pulses proportional to the SMU voltage. Additionally, the pulse waveform may be acquired under various different loading conditions (e.g. open and shorted conditions) to enable obtaining accurate VCSEL device current and VCSEL device voltage. Under the open condition, the waveform may be used to derive the current-pulse VCSEL DUT waveform. Under the shorted condition, the voltage amplitude may be used to derive fixture leading resistance, which in turn may be used to correct the VCSEL DUT voltage value.

This Summary is intended to provide a brief overview of some of the subject matter described in this document.

Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

The foregoing, as well as other objects, features, and advantages of this invention may be more completely understood by reference to the following detailed description when read together with the accompanying drawings in which.

Figure 1:
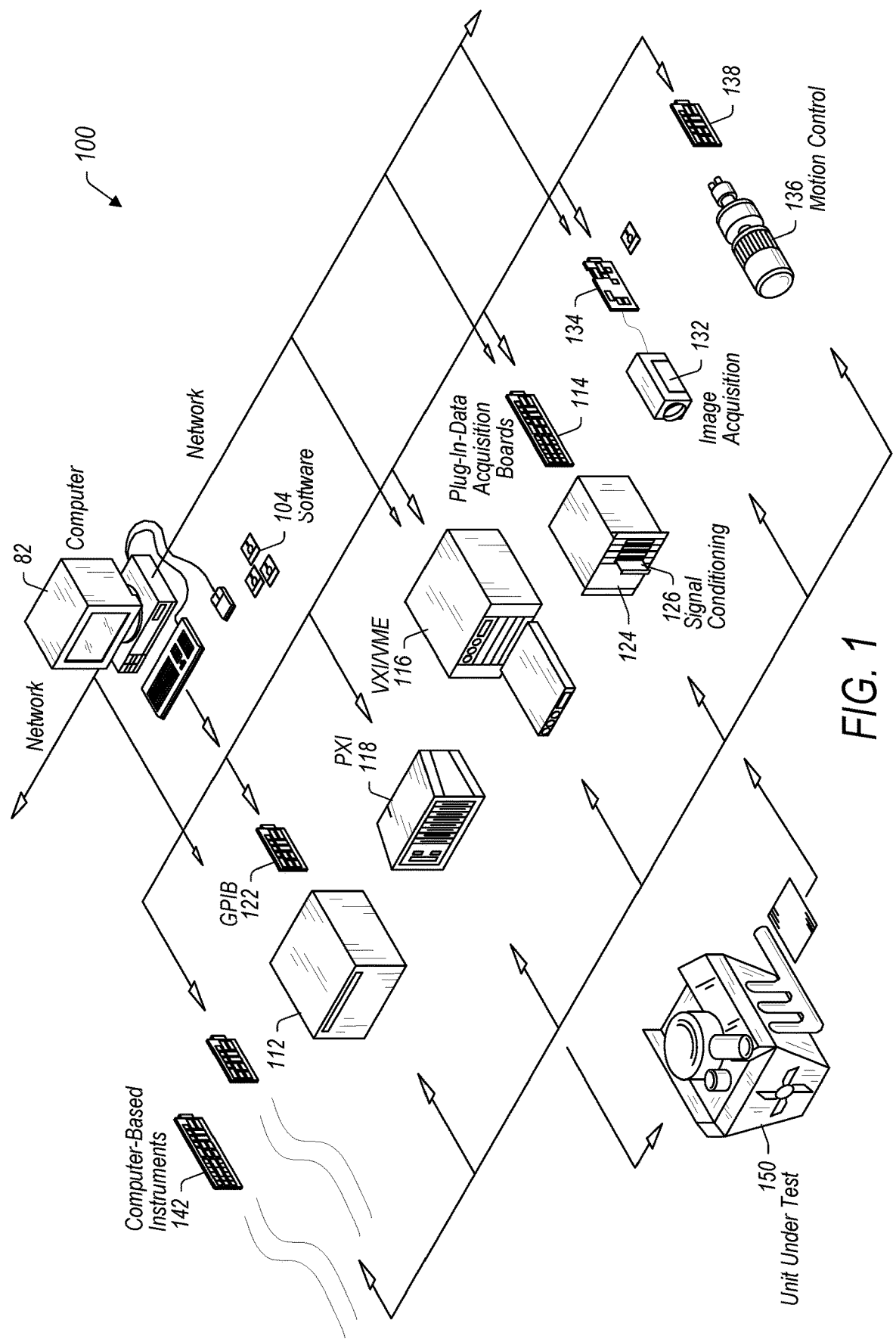
FIG. 1 shows an exemplary instrumentation control system with instruments networked together, according to some embodiments.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must)." The term "include", and derivations thereof, mean "including, but not limited to". The term "coupled" means "directly or indirectly connected".

DETAILED DESCRIPTION OF THE EMBODIMENTS

Terms

The following is a glossary of terms that may appear in the present disclosure:

Memory Medium—Any of various types of non-transitory memory devices or storage devices. The term "memory medium" is intended to include an installation medium, e.g., a CD-ROM, floppy disks, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. The memory medium may comprise other types of non-transitory memory as well or combinations thereof. In addition, the memory medium may be located in a first computer system in which the programs are executed, or may be located in a second different computer system which connects to the first computer system over a network, such as the Internet. In the latter instance, the second computer system may provide program instructions to the first computer system for execution. The term "memory medium" may include two or more memory mediums which may reside in different locations, e.g., in different computer systems that are connected over a network. The memory medium may store program instructions (e.g., embodied as computer programs) that may be executed by one or more processors.

Computer System (or Computer)—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" may be broadly defined to encompass any device (or combination of devices) having at least one processor that executes instructions from a memory medium.

Processing Element (or Processor)—refers to various elements or combinations of elements that are capable of performing a function in a device, e.g., in a user equipment device or in a cellular network device. Processing elements may include, for example: processors and associated memory, portions or circuits of individual processor cores, entire processor cores, processor arrays, circuits such as an ASIC (Application Specific Integrated Circuit), programmable hardware elements such as a field programmable gate array (FPGA), as well any of various combinations of the above.

Configured to—Various components may be described as "configured to" perform a task or tasks. In such contexts, "configured to" is a broad recitation generally meaning "having structure that" performs the task or tasks during operation. As such, the component can be configured to perform the task even when the component is not currently performing that task (e.g., a set of electrical conductors may be configured to electrically connect a module to another module, even when the two modules are not connected). In some contexts, "configured to" may be a broad recitation of structure generally meaning "having circuitry that" performs the task or tasks during operation. As such, the component can be configured to perform the task even when the component is not currently on. In general, the circuitry that forms the structure corresponding to "configured to" may include hardware circuits.

VCSEL—Vertical-Cavity Surface-Emitting Laser—a type of semiconductor laser diode with laser beam emission perpendicular from the top surface, contrary to conventional edge-emitting semiconductor lasers which emit from surfaces formed by cleaving the individual chip out of a wafer.

LIV Sweep Test—Light-Intensity-Current-Voltage Sweep Test—a measurement to determine operating characteristics of a laser diode. In the LIV test, current applied to the laser diode is swept and the intensity of the resulting emitted light is measured using a photo detector.

In some aspects, the LIV test involves sweeping the current through the VCSEL device and measuring the current (I), forward voltage (V) and resulting light output (L).

SMU—Source Measurement Unit—an instrument that combines a sourcing function and a measurement function on the same pin or connector. An SMU may source voltage and/or current and may simultaneously measure voltage and/or current.

LiDAR—Light Detection and Ranging—a remote sensing method for measuring distances by illuminating a target with laser light and measuring the reflection with a sensor. In one sense, LiDAR involves the use of a pulsed laser to measure ranges, or distances.

TOF sensing—Time of Flight sensing—the measurement of the time taken by an object, particle or wave to travel a distance.

DUT—Device Under Test

Various components may be described as performing a task or tasks, for convenience in the description. Such descriptions should be interpreted as including the phrase "configured to." Reciting a component that is configured to perform one or more tasks is expressly intended not to invoke 35 U.S.C. § 112, paragraph six, interpretation for that component.

Example Measurement/Storage System

FIG. 1 illustrates an exemplary instrumentation control system 100 which may include a VCSEL device test system configured according to various embodiments disclosed herein. System 100 comprises a host computer 82 which may couple to one or more instruments configured to perform a variety of functions using system level health monitoring implemented according to various embodiments of the present invention. Host computer 82 may comprise a CPU, a display screen, memory, and one or more input devices such as a mouse or keyboard as shown. Computer 82 may operate with one or more instruments to analyze, measure, or control a unit under test (UUT) or process 150. The one or more instruments may include a GPIB instrument 112 and associated GPIB interface card 122, a data acquisition board 114 inserted into or otherwise coupled with chassis 124 with associated signal conditioning circuitry 126, a VXI instrument 116, a PXI instrument 118, a video device or camera 132 and associated image acquisition (or machine vision) card 134, a motion control device 136 and associated motion control interface card 138, and/or one or more computer based instrument cards 142, among other types of devices. The computer system may couple to and operate with one or more of these instruments. In some embodiments, the computer system may be coupled to one or more of these instruments via a network connection, such as an Ethernet connection, for example, which may facilitate running a high-level synchronization protocol between the computer system and the coupled instruments. The instruments may be coupled to the unit under test (UUT) or process 150, or may be coupled to receive field signals, typically generated by transducers. System 100 may be used in a data acquisition and control applications, in a test and measurement application, an image processing or machine vision application, a process control application, a man-machine interface application, a simulation application, or a hardware-in-the-loop validation application, among others. In some embodiments, at least some components of system 100, for example, PXI instrument 118, may be configured to perform VCSEL (device) testing as disclosed herein. For example, PXI instrument 118 may include some or all components of a VCSEL test system as disclosed herein to perform testing of VCSEL devices autonomously or under partial or full control of host computer 82.

Figure 2:
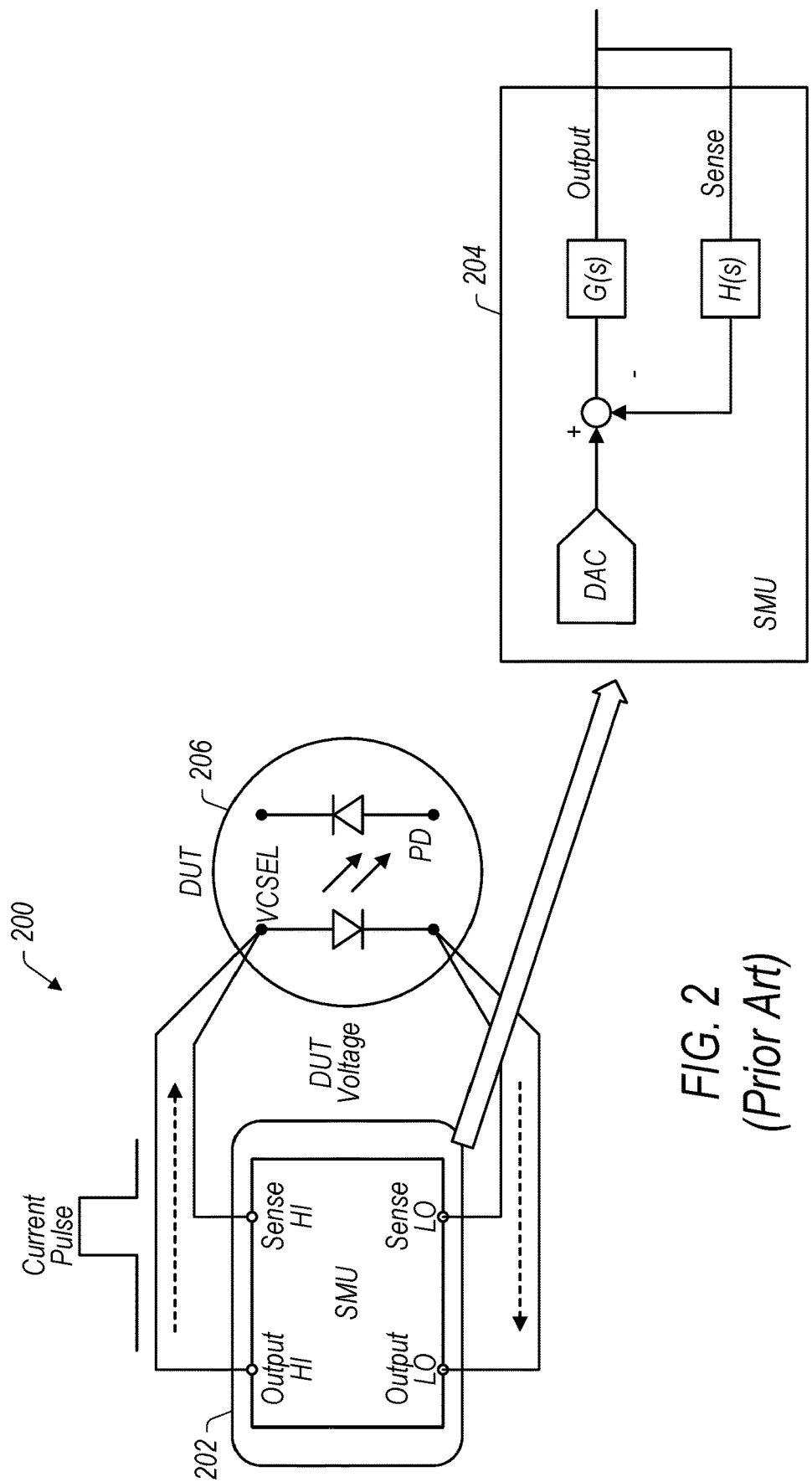
FIG. 2 shows an example of a traditional Vertical-Cavity Surface-Emitting Laser, VCSEL, test measurement system.

FIG. 2—Contemporary Light Intensity-Current-Voltage (LIV) Sweep Testing

As previously mentioned, Light-Intensity-current-Voltage (LIV) sweeping is a common production test performed on VCSEL devices to determine pass or fail by checking the operation characteristics of the device. The LIV test typically involves sweeping the current through the VCSEL (device) and measuring the current (I), forward voltage (V) and resulting light output (L).

FIG. 2 illustrates an exemplary contemporary VCSEL test system 200. As seen in FIG. 2, the test system 200 features a closed loop configuration including a Source Measure Unit (SMU) 202 which sources the test pulses to VCSEL DUT 206, and also measures the resulting signal developed across VCSEL DUT 206. FIG. 2 also illustrates a simplified system diagram 204 of the SMU 202. As shown in FIG. 2, SMU 202 includes four terminals, two output terminals for sourcing a signal, and two sense terminals for sensing a signal. The test system (or setup) shown in FIG. 2 represents a traditional current sweeping and IV (current/voltage) measurement solution which utilizes a closed loop control equipment (in this case SMU 202) to generate a current pulse, then measure the pulsed current amount and voltage amplitude across DUT 206. However, the signal generation and measurement capabilities of SMU 202 are limited by its bandwidth and cabling length.

As the demand of distance and velocity measurement grows, VCSELs used in TOF (time of flight) sensing and LiDAR require pulse widths on the order of a couple nanoseconds. However, the relatively low sample rate and low bandwidth of SMU limit the pulse width to the microseconds range. The phase margin of the control loop also limits the capacity of the SMU when it comes to generating high-speed current pulses over long cables. When the SMU is set to generate a current pulse, it is expected to be located close to DUT in order to minimize inductance loading. However, in real-life production test systems the test instrument is typically at least a couple of meters away from the DUT. Cables of that length (at least 2 meters) may heavily reduce the phase margin and may thereby cause system instability. In addition to the phase margin limitation, the inductance of a long cable may also degrade the pulse-current ramping rate in a closed-loop control configuration. In order to address the application challenges faced by traditional IV test solutions mentioned above, an open-loop control system and a set of compensation algorithms may be implemented to more accurately and efficiently test VCSEL devices.

Figure 3:
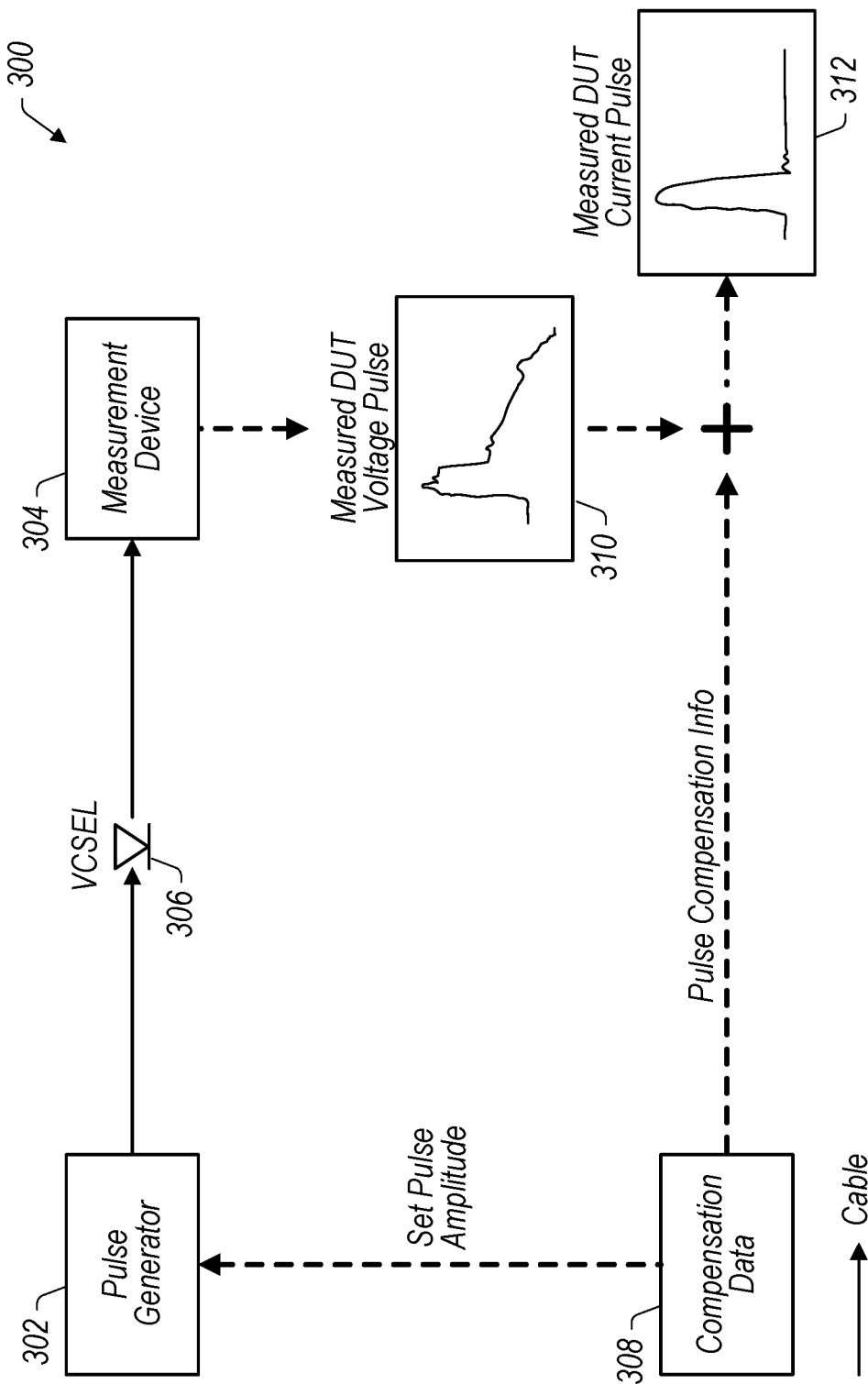
FIG. 3 shows a simplified system diagram of an exemplary VCSEL test measurement system, according to some embodiments.

FIG. 3—Exemplary VCSEL IV Nanoseconds Pulse Test System

FIG. 3 shows a simplified system diagram of an exemplary VSCEL test system 300. The system 300 incorporates a high-speed pulse generator 302 to produce a nanoseconds pulse (i.e. a pulse having a pulse width in the nanosecond range) having an amplitude based at least on some portion of compensation data 308, and further incorporates a high-speed measurement device 304 (e.g. a high-speed oscilloscope or scope, for short) to measure the voltage pulse developed across the VCSEL DUT 306 responsive to the generated nanosecond pulse. The measured DUT voltage pulse 310 may then be used to obtain the VCSEL DUT voltage and the corresponding VCSEL device current pulse 312 according to compensation information obtained based at least on some portion of compensation data 308 as will be further detailed below. The system 300 may implement measuring pulse current by comparing pulse voltages under different load conditions as part of a compensation algorithm used to scale the pulse voltage at the pulse generator 302 to the desired pulse current at the VCSEL DUT 306. The compensation algorithm may further be used to correct system measurement errors by characterizing various system components and equipment, for example the pulse generator 302, the measurement device 304, cables interconnecting pulse generator 302, measurement device 304, and VCSEL DUT 306, and other system elements, and to compensate for signal loss resulting from transmission of a high-speed signal over a long cable.

Figure 4:
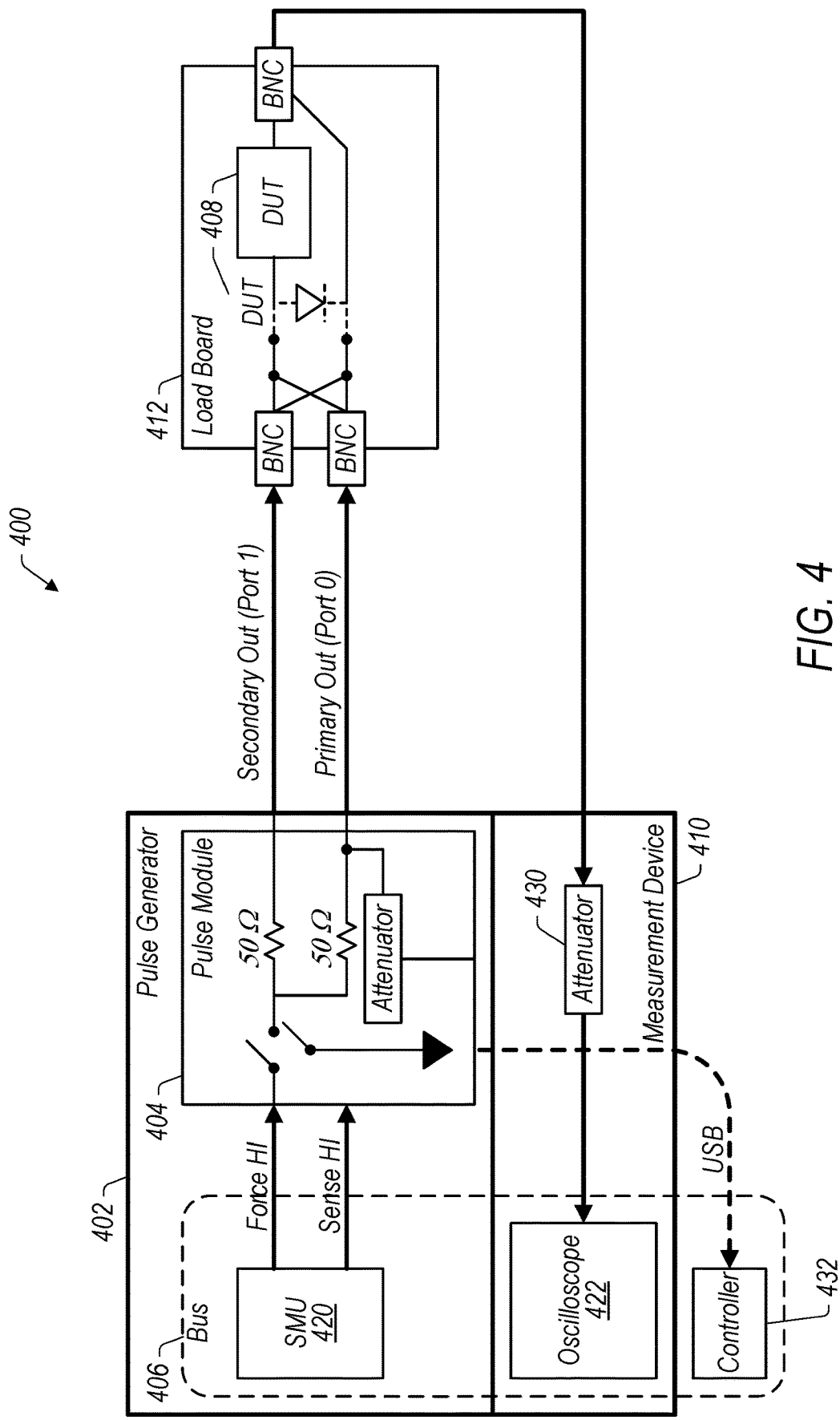
FIG. 4 shows a more detailed simplified system diagram of an exemplary VCSEL test measurement system, according to some embodiments.
Figure 5:
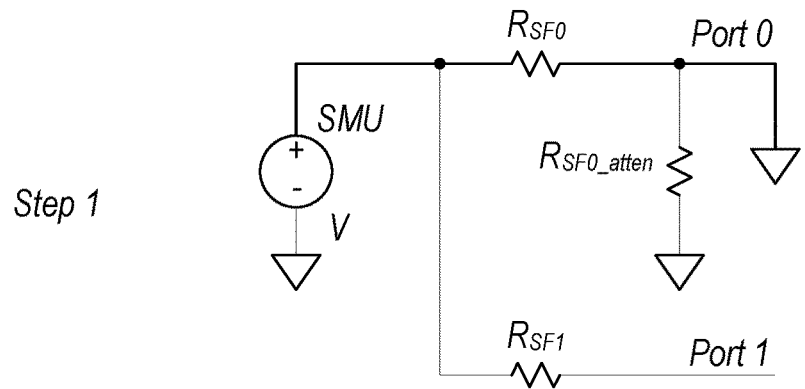
FIG. 5 shows a simplified equivalent circuit of an exemplary pulse generator in a VCSEL test measurement system with first configuration settings applied during a system compensation procedure, according to some embodiments.
Figure 6:
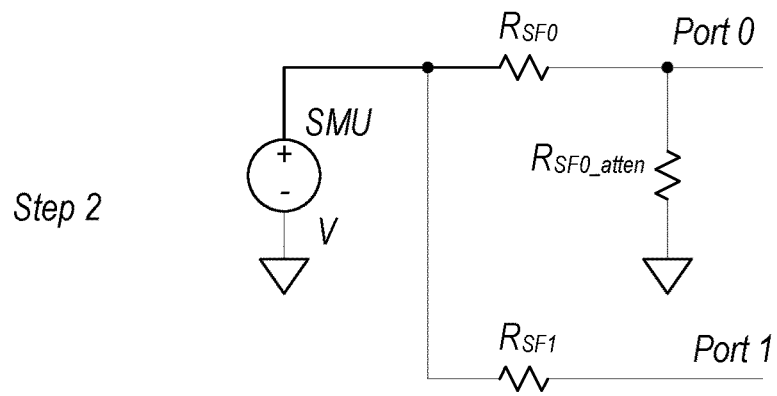
FIG. 6 shows a simplified equivalent circuit of an exemplary pulse generator in a VCSEL test measurement system with second configuration settings applied during the system compensation procedure, according to some embodiments.
Figure 7:
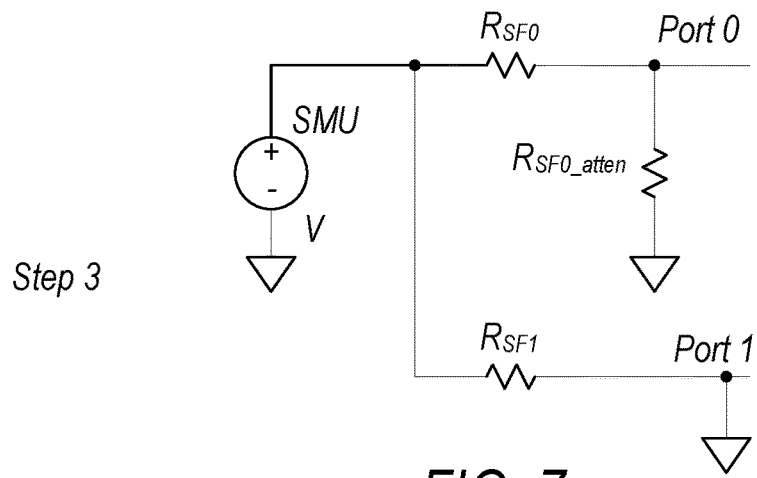
FIG. 7 shows a simplified equivalent circuit of an exemplary pulse generator in a VCSEL test measurement system with third configuration settings applied during the system compensation procedure, according to some embodiments.
Figure 8:
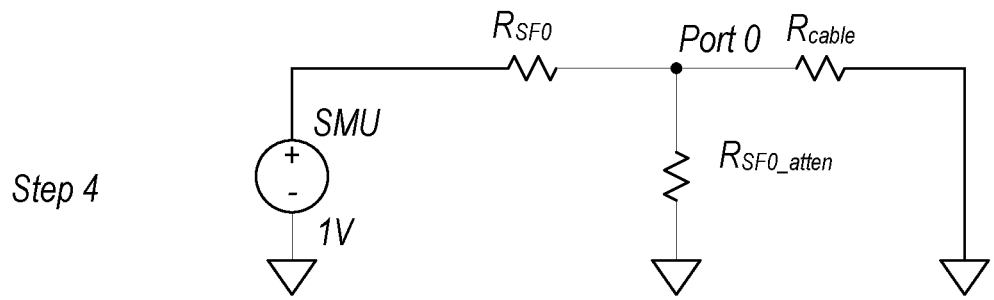
FIG. 8 shows a simplified equivalent circuit of an exemplary VCSEL test measurement system with fourth configuration settings applied during the system compensation procedure, according to some embodiments.
Figure 9:
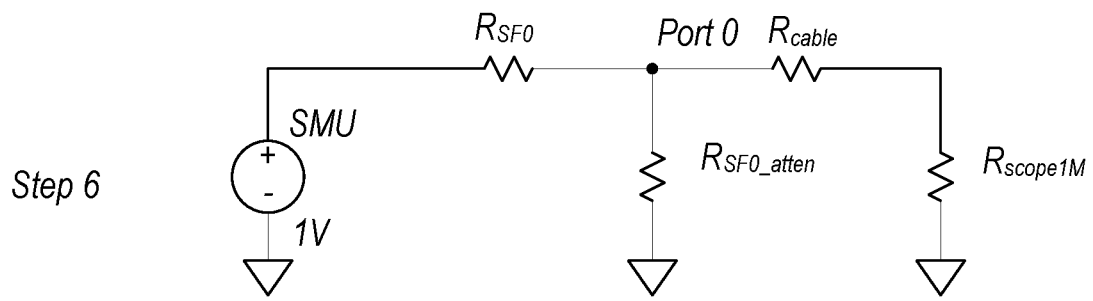
FIG. 9 shows a simplified equivalent circuit of an exemplary VCSEL test measurement system with fifth configuration settings applied during the system compensation procedure, according to some embodiments.
Figure 10:
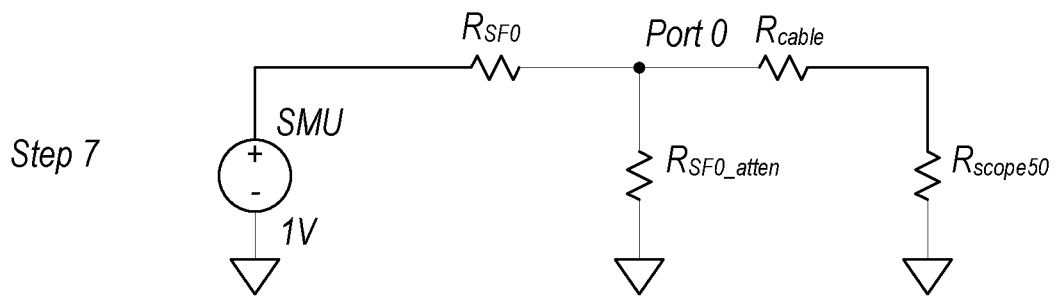
FIG. 10 shows a simplified equivalent circuit of an exemplary VCSEL test measurement system with sixth configuration settings applied during the system compensation procedure, according to some embodiments.
Figure 11:
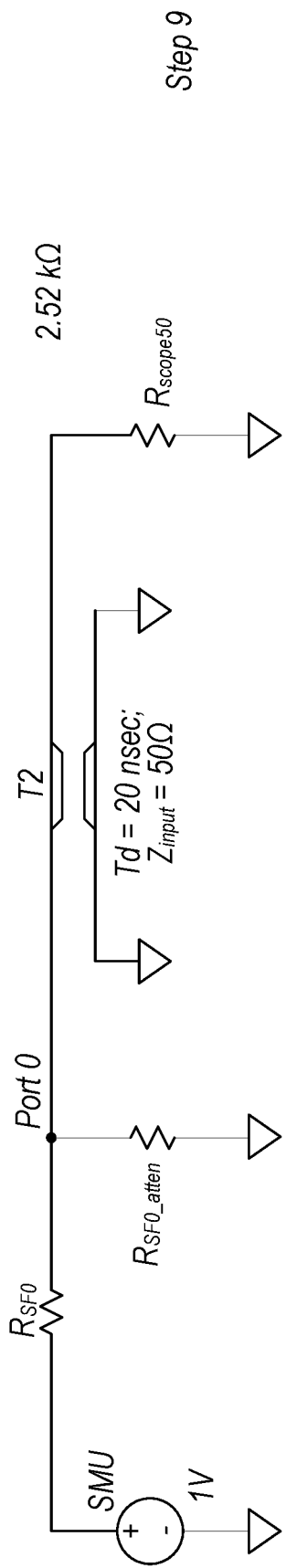
FIG. 11 shows a simplified equivalent circuit of an exemplary VCSEL test measurement system with seventh configuration settings applied during the system compensation procedure, according to some embodiments.
Figure 12:
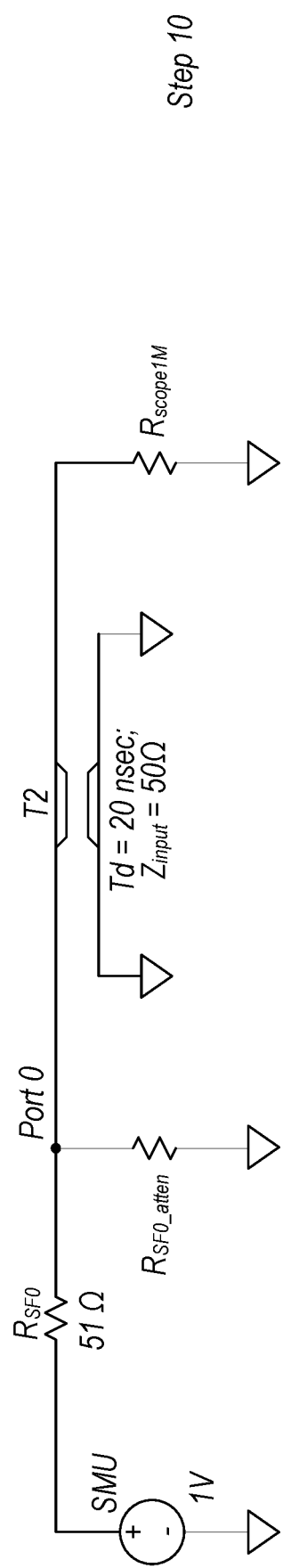
FIG. 12 shows a simplified equivalent circuit of an exemplary VCSEL test measurement system with eighth configuration settings applied during the system compensation procedure, according to some embodiments.
Figure 13:
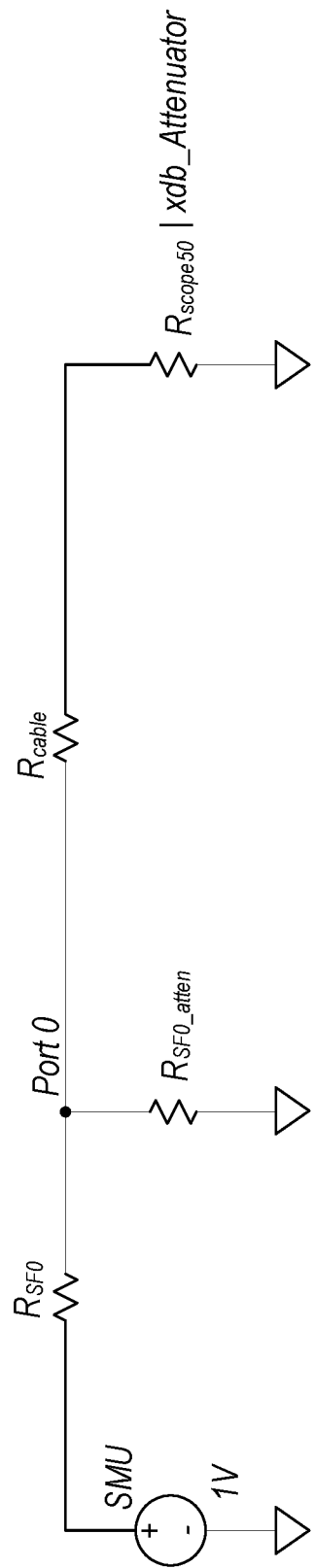
FIG. 13 shows a simplified equivalent circuit of an exemplary VCSEL test measurement system with ninth configuration settings applied during the system compensation procedure, according to some embodiments.

FIG. 4—More Detailed Exemplary VCSEL IV Nanoseconds Pulse Test System

FIG. 4 shows a more detailed simplified system diagram of an exemplary VCSEL test measurement system 400. The system 400 includes a high speed pulse generator 402 and a high speed measurement device 410. In some embodiments, pulse generator 402 may include a pulse module 404 that receives a voltage from an SMU 420 and generates high-speed current pulses proportional to the received voltage. In some aspects, a minimum pulse width output by pulse module 404 may be 5 ns. More generally, the minimum (i.e. the narrowest) pulse width may be limited by the switching speed of pulse module 404. In some embodiments, high speed measurement device 410 may include a high-speed oscilloscope (scope, for short) 422, which may have a specified input bandwidth, e.g. a 1.5 GHz input bandwidth. Accordingly, a sample rate of up to 5 Gsps (Giga-samples per second) may be used to measure the nanoseconds pulses. An attenuator 430 may be used as required to attenuate the signal to a specified input amplitude range of the scope 422. As shown in FIG. 4, the SMU 420 and scope 422 may be coupled to an interconnecting bus 406 and may be controlled via the interconnecting bus 406 through a controller, or control circuit 432. In some aspects, controller 432 may receive data/information from pulse module 404, and may use the received data/information in controlling the voltage that SMU 420 provides to pulse module 404. DUT 408 may be configured on a load board 412 for the purposes of testing, using BNC input connectors on load board 412 to couple to the output ports of pulse generator 402, and using a BNC output connector on load board 412 to couple to the input of measurement device 410. In some embodiments, controller 432 may be a control circuit or a controller included in an instrument such as PXI instrument 118, or it may be a host such as computer 82, or it may be a combination of components that includes computer 82 or it may be an autonomous external controller. In some aspects controller 432 may include various elements (e.g. circuits) or combinations of elements that are capable of controlling at least pulse generator 402 and measurement device 410. Controller 432 may include, for example: general purpose processors and associated memory, portions or circuits of individual processor cores, entire processor cores or processing circuit cores, processing circuit arrays or processor arrays, circuits such as ASICs (Application Specific Integrated Circuits), programmable hardware elements such as a field programmable gate array (FPGA), as well as any of various combinations of the above.

System Operation

According to some aspects, the operation of system 400 may include three main stages. A pre-test compensation stage, a VCSEL voltage derivation stage, and a VCSEL current derivation stage.

Pre-Test Compensation

First, a pre-test compensation procedure may be performed in order to correctly set the pulse amplitude for the nanoseconds pulse(s) and accurately perform the IV (current/voltage) measurement. More specifically, the pre-test compensation procedure may be used to characterize the system 400 and the pulse (output by pulse generator 402) prior to performing the IV measurements. The pre-test compensation procedure may be split into a system compensation procedure and a pulse compensation procedure.

System Compensation Procedure

The system compensation procedure may include performing a series of operational steps to obtain the characteristics of each system component, including the scope 422, pulse module 404, attenuator 430, and the interconnecting cables between load board 412 and pulse generator 402 and measurement device 410, respectively. The following chart illustrates exemplary parameters that may be obtained through the system compensation procedure.

| System Components | Parameters of System Components |
| --- | --- |
| Pulse Generator | Output Impedance |
| Cables | Pulse Output Cable Loss |
|  | Scope Measurement Cable Loss |
|  | Pulse Output Cable Impedance |
|  | Scope Measurement Cable Impedance |
| Scope | Scope Measurement Error Correction Factor |
|  | Scope Input Impedance |

An exemplary system compensation procedure is described below with respect to FIGS. 5-13. As indicated in the chart above, there are several unknown system parameters that may be obtained through the system compensation procedure. A more detailed list of parameter values that may be obtained through the system compensation procedure is provided below. The parameters, or values of the parameters, in bold underlined print may be used for compensating the pulse waveform and for calculating the voltage and current. The remaining parameters represent intermediate parameters obtained throughout the procedure. The intermediate parameters may also be saved and reused for repeating parts or all of the compensation procedure.

$ACF_{50}$ Scope measurement error correction factor @ 50Ω input $ACF_{1M}$ Scope measurement error correction factor @ 1MΩ input

- $ACF_{atten}$ Scope measurement error correction factor @ 50Ω input with 50Ω xdB attenuator (note: "x" refers to a selected positive value, e.g. 30, selected as required in the specific system implementation or set of embodiments)

$R_{SF0}$ Pulse generator Port 0 output resistance $R_{SF0\_atten}$ Pulse generator Port 0 internal attenuator resistance $R_{SF1}$ Pulse generator Port 1 output resistance $R_{scope50}$ Scope input resistance @ 50Ω input impedance $R_{scope1M}$ Scope input resistance @ 1MΩ input impedance

- $R_{scope\_atten}$ Scope input resistance @50Ω input with 50Ω xdB attenuator $Loss_{SF0}$ Pulse generator Port 0 cable loss (Resistive Loss and Dielectric Loss)

$Loss_{SF1}$ Pulse generator Port 1 cable loss (Resistive Loss and Dielectric Loss)

- $Loss_{scope}$ Scope cable loss (Resistive Loss and Dielectric Loss)

- $Z_{SF0}$ Pulse generator Port 0 cable impedance

- $Z_{SF1}$ Pulse generator Port 1 cable impedance

- $Z_{scope}$ Scope cable impedance

First setting: Port 0 of the pulse generator is shorted while Port 1 of the pulse generator is left open.

Step 1—Measure the resistance of Port 0 of the pulse generator. Set pulse generator in DC calibration mode. SMU output=1 VDC. See circuit diagram in FIG. 5.

$$R_{SF0} = \frac{V_{SMU}}{I_{SMU}}$$

Second setting: Port 0 and Port 1 of pulse generator remain open.

Step 2—Measure the internal attenuator resistance of Port 0 of the pulse generator. Set pulse generator in DC calibration mode. SMU output=1 VDC. See circuit diagram in FIG. 6.

$$R_{SF0\_atten} = \frac{V_{SMU}}{I_{SMU}} - R_{SF0}$$

Third setting: Port 0 of the pulse generator is left open while Port 1 of the pulse generator is shorted.

Step 3—Measure the output resistance of Port 1 of the pulse generator. Set pulse generator in DC calibration mode. SMU output=1 VDC. See circuit diagram in FIG. 7.

$$R_{SF1} = \frac{V_{SMU}}{I_{SMU} - \frac{V_{SMU}}{R_{SF} + R_{SF0\_atten}}}$$

This completes the pulse generator characterization, and the following measured module parameters may be saved:

$R_{SF0}$ Pulse generator Port 0 output resistance $R_{SF0\_atten}$ Pulse generator Port 0 internal attenuator resistance $R_{SF1}$ Pulse generator Port 1 output resistance Fourth setting: One BNC terminal of the cable is connected to Port 0 of the pulse generator and the other BNC terminal of the cable is shorted.

Step 4—Measure BNC Cable DC Resistance. Set pulse generator in DC calibration mode. SMU output=1 VDC. See circuit diagram in FIG. 8.

$$R_{cable} = \frac{R_{SF0\_atten} \cdot V_{SMU} - I_{SMU} \cdot R_{SF0} \cdot R_{SF0\_atten}}{I_{SMU} \cdot R_{SF0} - V_{SMU} + I_{SMU} \cdot R_{SF0\_atten}}$$

Fifth setting: The short is removed from previously shorted BNC terminal and is connected to the measurement instrument/scope. See circuit diagram in FIG. 9.

Step 5—Measure Scope Input Resistance @ 1 MΩ input impedance.

$$R_{scope1M} = -1 \cdot \left( R_{cable} + \frac{(R_{cable} + R_{SF0\_atten}) \cdot \left(R_{SF0} - \frac{V_{SMU}}{I_{SMU}}\right)}{\frac{R_{SF0} - \frac{V_{SMU}}{I_{SMU}}}{R_{SF0\_atten}} + 1} \right)$$

Step 6—Correct Scope DC error @ 1MΩ input impedance. Set pulse generator in DC calibration mode. SMU output=1 VDC.

$$V_{scope1M\_expected} = \frac{I_{SMU} \cdot R_{scope1M} \cdot R_{SF0\_atten}}{R_{cable} + R_{scope1M} + R_{SF0\_atten}}$$

The uncorrected scope measurement is: $V_{scope1M\_raw}$. A correction factor for the scope measurement may be calculated as:

$$ACF_{1M} = \frac{V_{scope1M\_expected}}{V_{scope1M\_raw}}$$

Step 7—Measure scope input resistance @ 50Ω input impedance. Set scope input impedance to be 50Ω. Set pulse generator in DC calibration mode. SMU output=1 VDC. See circuit diagram in FIG. 10.

$$R_{scope50} = -1 \cdot \left( R_{cable} + \frac{(R_{cable} + R_{SF0\_atten}) \cdot \left(R_{SF0} - \frac{V_{SMU}}{I_{SMU}}\right)}{\frac{R_{SF0} - \frac{V_{SMU}}{I_{SMU}}}{R_{SF0\_atten}} + 1} \right)$$

Step 8—Correct scope DC error @ 50Ω input impedance.

$$V_{scope50\_expected} = \frac{I_{SMU} \cdot R_{scope50} \cdot R_{SF0\_atten}}{R_{cable} + R_{scope50} + R_{SF0\_atten}}$$

The uncorrected scope measurement is: $V_{scope50\_raw}$. A correction factor for the scope measurement may be calculated as:

$$ACF_{50} = \frac{V_{scope50\_expected}}{V_{scope50\_raw}}$$

The corrected scope measurements may then be used to characterize the scope cable, also referred to herein as the $1^{st}$ cable. The scope cable ($1^{st}$ cable) may be characterized using Steps 9 and 10 below.

Step 9—Measure pulse with scope set at 50Ω input. Set scope input impedance to be 50Ω. Set pulse generator in pulse mode to generate a 4V pulse to obtain $V_{scope50}$. See circuit diagram in FIG. 11.

Step 10—Measure pulse with scope set at 1MΩ input. Set scope input impedance to be 1MΩ. Set pulse generator in pulse mode and generate a 4V pulse to obtain $V_{scope1M}$. See circuit diagram in FIG. 12.

The cable impedance may then be derived by:

$$Z_{cable} = \frac{R_{scope50} \cdot V_{scope50} \cdot R_{scope1M} - R_{scope50} \cdot R_{scope1M} \cdot V_{scope1M}}{R_{scope50} \cdot V_{scope1M} - V_{scope50} \cdot R_{scope1M}}$$

$$Loss_{cable} = \frac{V_{scope50} \cdot (R_{SF0} + \text{para}(R_{SF0\_atten} \cdot Z_{cable})) \cdot (Z_{cable} + R_{scope50})}{2 \cdot V_{SMU} \cdot R_{scope50} \cdot \text{para}(R_{SF0\_atten} \cdot Z_{cable})}$$

Step 11 and Step 12—Repeat Step 9 and Step 10 to characterize the pulse generator Port 0 cable, also referred to herein as the $2^{nd}$ cable, e.g. to obtain cable loss and cable impedance for the $2^{nd}$ cable.

Sixth setting: Replace the BNC cable with the $3^{rd}$ cable.

Step 13 and Step 14—Repeat Step 9 and Step 10 to characterize the pulse generator Port 1 cable, also referred to herein as the $3^{rd}$ cable, e.g. obtain cable loss and cable impedance for the $3^{rd}$ cable.

This completes the scope and cable characterization, and the following measured parameters may be saved:

$ACF_{50}$ Scope measurement error correction factor @ 50Ω input
  $ACF_{1M}$ Scope measurement accuracy correction factor @ 1MΩ input
  $R_{scope50}$ Scope input resistance @50Ω input impedance
  $R_{scope1M}$ Scope input resistance @ 1MΩ input impedance
  $Loss_{SF0}$ Pulse generator Port 0 cable loss (Resistive Loss and Dielectric Loss)
  $Loss_{SF1}$ Pulse generator Port 1 cable loss (Resistive Loss and Dielectric Loss)
  $Loss_{scope}$ Scope cable loss (Resistive Loss and Dielectric Loss)
  $Z_{SF0}$ Pulse generator Port 0 cable impedance
  $Z_{SF1}$ Pulse generator Port 1 cable impedance
  $Z_{Scope}$ Scope cable impedance
  $R_{cable}$ $1^{st}$ cable resistance, i.e. scope cable resistance Seventh setting: Replace BNC cable with $1^{st}$ BNC cable. Attach xdB BNC attenuator to the input of scope. See circuit diagram of FIG. 13.

Step 15—Measure scope input resistance @ 50Ω with xdB BNC attenuator. Set scope input impedance to be 50Ω. Set pulse generator in DC calibration mode. SMU output=1 VDC.

$$R_{scope\_atten} = -1 \cdot \left( R_{cable} + \frac{(R_{cable} + R_{SF0\_atten}) \cdot \left( R_{SF0} - \frac{V_{SMU}}{I_{SMU}} \right)}{\frac{R_{SF0} - \frac{V_{SMU}}{I_{SMU}}}{R_{SF0\_atten}} + 1} \right)$$

Step 16—Correct Scope DC error @ 50Ω with xdB BNC attenuator.

$$V_{scope\_atten\_expected} = \frac{I_{SMU} \cdot R_{scope\_atten} \cdot R_{SF0\_atten}}{R_{cable} + R_{scope\_atten} + R_{SF0\_atten}}$$

The uncorrected scope measurement is: $V_{scope\_atten\_raw}$. A correction factor for the scope measurement may be calculated as:

$$ACF_{atten} = \frac{V_{scope\_atten\_expected}}{V_{scope\_atten\_raw}}$$

This completes the scope input characterization, and the following measured module parameters may be saved:

$ACF_{atten}$ Scope measurement error correction factor @ 50Ω input with 50Ω xdB attenuator
  $R_{scope\_atten}$ Scope input resistance @ 50Ω input with 50Ω xdB attenuator This completes the system compensation procedure, and the following parameters may be used for pulse correction and DUT test:

$ACF_{atten}$ Scope measurement error correction factor @ 50Ω input impedance with 50Ω xdB attenuator
  $R_{scope\_atten}$ Scope input resistance @ 50Ω input impedance with 50Ω xdB attenuator
  $Loss_{scope}$ Scope cable loss (Resistive Loss and Dielectric Loss)
  $Z_{SF0}$ Pulse generator Port 0 cable impedance
  $Z_{SF1}$ Pulse generator Port 1 cable impedance
  $Z_{Scope}$ Scope cable impedance The following system compensation data may be saved for further re-compensation, pulse compensation, or pulse measurement:

$R_{SF0}$ Pulse generator Port 0 output resistance
  $R_{SF0\_atten}$ Pulse generator Port 0 internal attenuator resistance
  $R_{SF1}$ Pulse generator Port 1 output resistance
  $ACF_{50}$ Scope measurement error correction factor @ 50Ω input impedance
  $ACF_{1M}$ Scope measurement error correction factor @ 1 MΩ input impedance
  $R_{scope50}$ Scope input resistance @ 50Ω input impedance
  $R_{scope1M}$ Scope input resistance @1 MΩ input impedance
  $Loss_{SF0}$ Pulse generator Port 0 cable loss (Resistive Loss and Dielectric Loss)
  $Loss_{SF1}$ Pulse generator Port 1 cable loss (Resistive Loss and Dielectric Loss)
  $Loss_{scope}$ Scope cable loss (Resistive Loss and Dielectric Loss)
  $Z_{SF0}$ Pulse generator Port 0 cable impedance $Z_{SF1}$ Pulse generator Port 1 cable impedance
$Z_{Scope}$ Scope cable impedance
$R_{cable}$ 1$^{st}$ Cable resistance (i.e. scope cable resistance)
$ACF_{atten}$ Scope measurement error correction factor @ 50 ohm input with 50 ohm xdB attenuator
$R_{scope\_atten}$ Scope input resistance @50 ohm input with 50 ohm xdB attenuator Pulse Compensation Procedure The pulse compensation procedure may be used to capture or measure the generated nanosecond pulse under different load conditions of the pulse generator, including open loading, short loading, and "known-good" DUT loading. A "known-good" DUT is representative of typical operational characteristics of a DUT, e.g. voltage drop and impedance of the DUT. In one sense a "known-good" DUT may therefore be considered a known device or DUT used for the pulse compensation procedure as a representative of DUT devices expected to be tested in the future. The pulse compensation may be primarily used to obtain a scaling relationship between the SMU voltage-setting, or SMU voltage, and DUT current-setting, or DUT current. Following the pulse compensation, appropriate scaling coefficients may be used to set up the SMU and generate high-speed current pulses proportional to the SMU voltage. The waveform acquired under open loading conditions may later be used to derive the VCSEL current pulse waveform during actual VCSEL DUT measurements. The voltage amplitude acquired under shorted loading conditions may be used to derive fixture leading resistance which may be later used to correct the VCSEL voltage amount during actual VCSEL DUT measurements.

Figure 14:
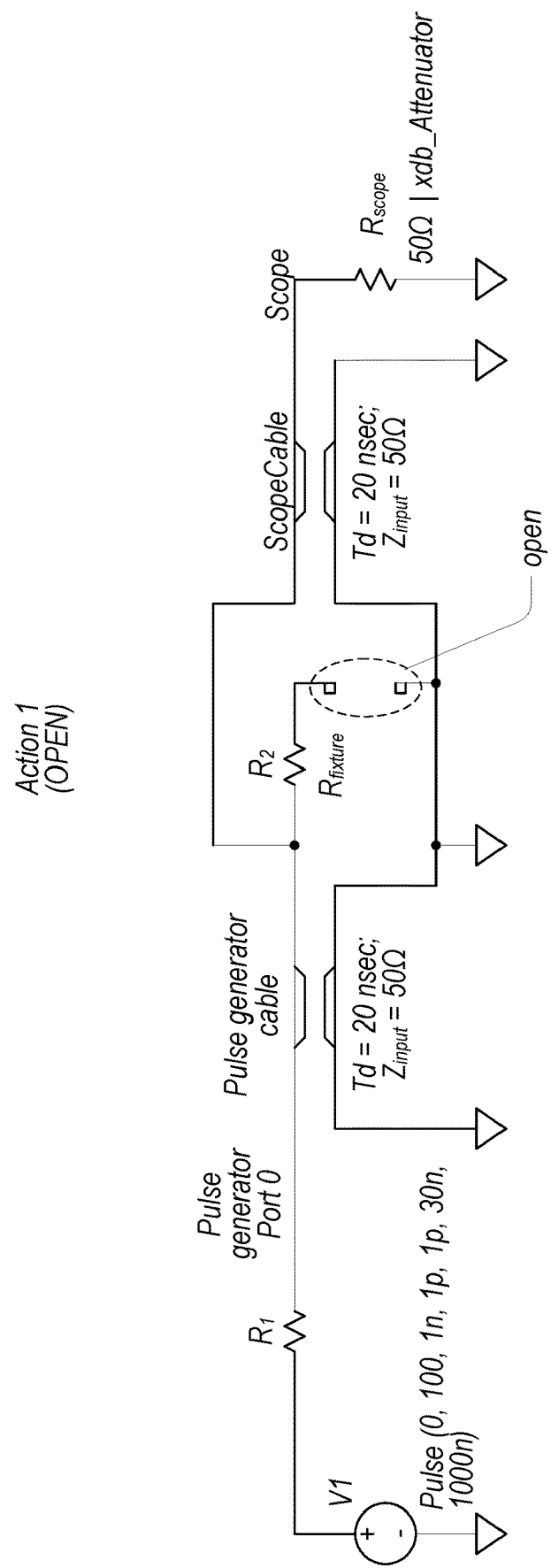
FIG. 14 shows a simplified equivalent circuit of an exemplary VCSEL test measurement system with first configuration settings applied during a pulse compensation procedure, according to some embodiments.
Figure 15:
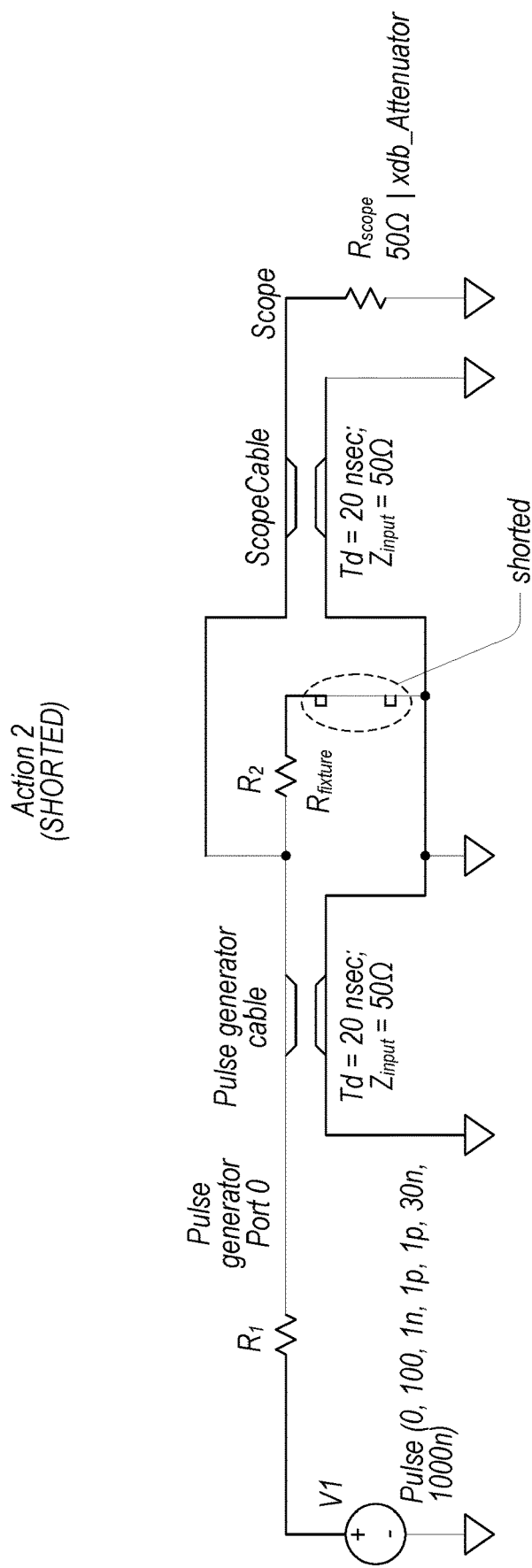
FIG. 15 shows a simplified equivalent circuit of an exemplary VCSEL test measurement system with second configuration settings applied during the pulse compensation procedure, according to some embodiments.
Figure 16:
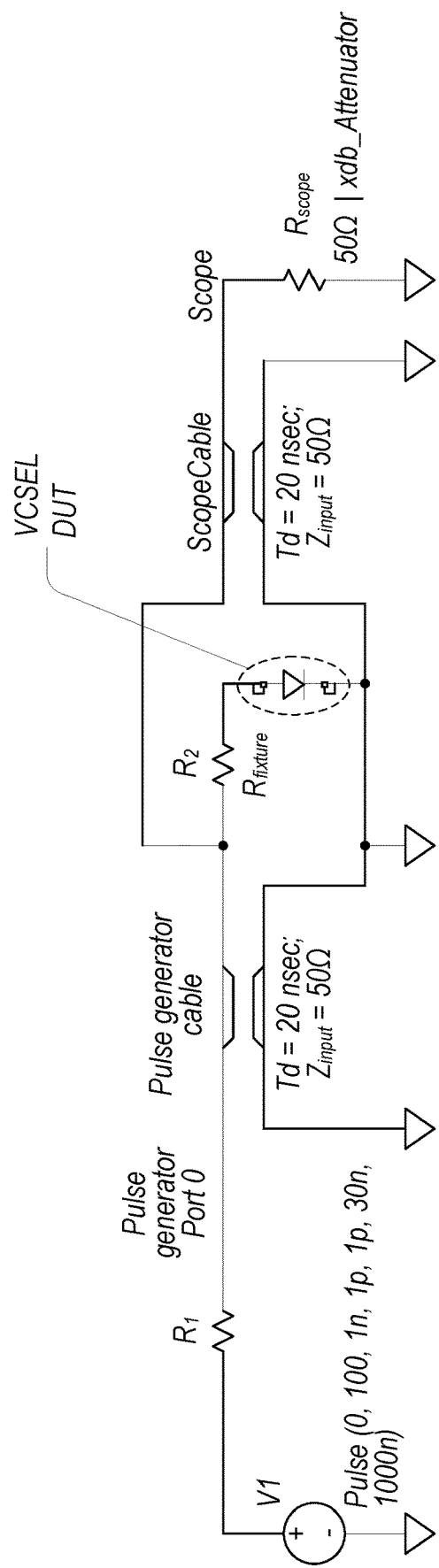
FIG. 16 shows a simplified equivalent circuit of an exemplary VCSEL test measurement system with third configuration settings applied during the pulse compensation procedure, according to some embodiments.

An exemplary pulse compensation procedure is described below with respect to FIGS. 14-16. This procedure may be used to characterize the scaling relation between SMU settings to DUT current by performing OPEN/DUT measurements. It may also include performing OPEN/SHORT measurements to obtain fixture series resistance which may be subsequently used to compensate the DUT voltage. The pulse width may thus be compensated to match the desired pulse-on time (or pulse width).

Pulse Amplitude Correction and Fixture Resistance Measurement:

The following formulas may be used to calculate the DUT voltage and current using scope measurements.

For single-port pulse generation:

$$\text{Current}_{DUT}(V_{SMU}) = \frac{(V_{scope\_OPEN} - V_{scope\_DUT}) \cdot (Z_{SF0} + Z_{scope}) \cdot (R_{scope\_atten} + Z_{scope})}{2 \cdot Z_{SF0} \cdot R_{scope\_atten} \cdot Z_{scope} \cdot \text{Loss}_{scope}}$$

For two-port pulse generation:

$$\text{Current}_{DUT} = \frac{(V_{scope\_OPEN} - V_{scope\_DUT}) \cdot (Z_{SF0} + Z_{scope} + Z_{SF1} \cdot Z_{scope} + Z_{SF0} \cdot Z_{SF1}) \cdot (R_{scope\_atten} + Z_{scope})}{2 \cdot Z_{SF0} \cdot Z_{SF1} \cdot R_{scope\_atten} \cdot Z_{scope} \cdot \text{Loss}_{scope}}$$

The following formula may be used to calculate the DUT voltage, with scope measurement:

$$\text{Voltage}_{DUT} = \frac{V_{scope\_DUT} \cdot (R_{scope50} + Z_{scope})}{2 \cdot R_{scope\_atten} \cdot \text{Loss}_{scope}} - \text{Current}_{DUT} \cdot R_{Fixture}$$

As noted above, the following system parameters may have been obtained by performing system compensation:

$ACF_{atten}$ Scope measurement error correction factor @ 50Ω input impedance with 50Ω xdB attenuator (again, "x" refers to a positive number, specified as required by the given system implementation/embodiments)

$R_{scope\_atten}$ Scope input resistance @ 50Ω input impedance with 50Ω xdB attenuator $\text{Loss}_{scope}$ Scope cable loss (Resistive Loss and Dielectric Loss)

$Z_{SF0}$ Pulse generator Port 0 cable impedance
$Z_{SF1}$ Pulse generator Port 1 cable impedance
$Z_{Scope}$ Scope cable impedance The remaining unknowns to be obtained in order to derive the DUT voltage and current from scope measurements are:

$\text{Current}_{DUT}(V_{SMU})$ SMU voltage-settings vs DUT current-setting $R_{Fixture}$ The fixture resistance between the DUT and remote sense The relation between the SMU voltage and the DUT current-setting may be expressed as:

$$V_{SMU} = \frac{\text{Current}_{DUT} \cdot (R_{SF} + Z_{SF}) \cdot (Z_{SF} \cdot R_{DUT} + Z_{SF} \cdot Z_{scope} + R_{DUT} \cdot Z_{scope})}{2 \cdot Z_{scope} \cdot \text{Loss}_{SF} \cdot Z_{SF}}$$

Below are three methods to set the SMU voltage per current-setting, considering DUT resistance is unknown. An exemplary procedure designed according to the 2$^{nd}$ method will be further presented below.

1. Assuming the DUT resistance is 0.3Ω (0.3Ω is the nominal resistance obtained from a typical sample), the SMU voltage may be calculated per current-settings. This method may still enable plotting the IV curve but it may not allow the pulse generator to provide pulses that accurately represent the desired current.

2. The relationship between the SMU settings and the DUT current may be characterized using a "known-good" DUT. In such case it is not necessary to know the resistance of the known-good DUT, but the known-good DUT may need to provide an adequate representation of the typical resistance of used/expected DUTs, and the distribution of DUT resistance is tight.

3. The SMU output may be dynamically tweaked to regulate DUT current in a real test by comparing measured DUT current over different settings, which essentially represents closed loop control. It may provide the best current-setting accuracy, but the test times may be longer.

First setting: Set the load condition to OPEN, and connect the pulse generator cable and oscilloscope cable to the load. Configure the pulse generator to work in pulse mode. Step the SMU voltage from low to high, to obtain $V_{scope\_OPEN}$ ($V_{SMU}$). See the circuit diagram of FIG. 14.

Second setting: Set the load condition to SHORTED, and connect the pulse generator cable and oscilloscope cable to the load. Configure the pulse generator to work in pulse mode. Step the SMU voltage from low to high, to obtain $V_{scope\_SHORT}$ ($V_{SMU}$). See the circuit diagram of FIG. 15.

The single-port current output under short condition is expressed by:

$$\text{Current}_{SHORT}(V_{SMU}) = \frac{(V_{scope\_OPEN}(V_{SMU}) - V_{scope\_SHORT}(V_{SMU})) \cdot (Z_{SF0} + Z_{scope}) \cdot (R_{scope\_atten} + Z_{scope})}{2 \cdot Z_{SF0} \cdot R_{scope\_atten} \cdot Z_{scope} \cdot \text{Loss}_{scope}}$$

The two-port current output under short condition is expressed by:

$$\text{Current}_{SHORT}(V_{SMU}) = \\ \frac{(V_{scope\_OPEN}(V_{SMU}) - V_{scope\_SHORT}(V_{SMU})) \cdot (Z_{SF0} + Z_{scope} + Z_{SF1} \cdot Z_{scope} + Z_{SF0} \cdot Z_{SF1}) \cdot (R_{scope\_atten} + Z_{scope})}{2 \cdot Z_{SF0} \cdot Z_{SF1} \cdot R_{scope\_atten} \cdot Z_{scope} \cdot \text{Loss}_{scope}}$$

The fixture resistance may then be calculated as:

$$R_{Fixture} = \frac{V_{scope\_SHORT}}{\text{Current}_{SHORT}}$$

The fixture series resistance may be used to calculate the DUT Voltage.

Third setting: Set the load condition to "known-good" DUT, and connect the pulse generator cable and oscilloscope cable to the load. Sweep all pulse generator pulse voltages from low to high with the same steps of open pulse, to obtain $V_{scope\_DUT}(V_{SMU})$. See the circuit diagram of FIG. 16. The DUT current for each pulse step may be calculated.

The DUT Current sourced by a single pulse generator port may be obtained according to:

$$\text{Current}_{DUT}(V_{SMU}) = \frac{(V_{scope\_OPEN}(V_{SMU}) - V_{scope\_DUT}(V_{SMU})) \cdot (Z_{SF0} + Z_{scope}) \cdot (R_{scope\_atten} + Z_{scope})}{2 \cdot Z_{SF0} \cdot R_{scope\_atten} \cdot Z_{scope} \cdot \text{Loss}_{scope}}$$

The DUT current sourced by two pulse-generator ports may be obtained according to:

$$\text{Current}_{DUT}(V_{SMU}) = \\ \frac{(V_{scope\_OPEN}(V_{SMU}) - V_{scope\_DUT}(V_{SMU})) \cdot (Z_{SF0} + Z_{scope} + Z_{SF1} \cdot Z_{scope} + Z_{SF0} \cdot Z_{SF1}) \cdot (R_{scope\_atten} + Z_{scope})}{2 \cdot Z_{SF0} \cdot Z_{SF1} \cdot R_{scope\_atten} \cdot Z_{scope} \cdot \text{Loss}_{scope}}$$

In order to obtain the relationship between the DUT current and the SMU voltage, a function of the DUT current vs. SMU voltage may be plotted. The SMU voltage may be interpolated and calculated for desired current-settings.

This completes the pulse amplitude correction and fixture series resistance measurement, and the plot of the measured current vs SMU voltage-setting [$\text{Current}_{DUT}(V_{SMU})$], and the fixture series resistance [$R_{Fixture}$] may both be saved.

The following data may thus be obtained for pulse measurement:

$V_{scope\_OPEN}(V_{SMU})$ The measured pulse waveform under open load condition $V_{scope\_SHORT}(V_{SMU})$ The measured pulse waveform under short load condition $V_{scope\_DUT}(V_{SMU})$ The measured pulse waveform with DUT $R_{Fixture}$ Fixture impedance $\text{Current}_{DUT}(SMU)$ The relation between SMU settings and measured current VCSEL Voltage Derivation In some embodiments, the following algorithm may be used to derive the actual VCSEL device voltage by using the acquired VCSEL waveform (i.e. the measured VCSEL device voltage) and compensation data (or information) obtained from the system compensation.

$$\text{Voltage}_{DUT} = \frac{V_{scope\_DUT} \cdot (R_{scope\_atten} + Z_{scope})}{2 \cdot R_{scope\_atten} \cdot \text{Loss}_{scope}} - \text{Current}_{DUT} \cdot R_{Fixture}$$

where $V_{scope\_DUT}$ VCSEL voltage waveform acquired by scope
$R_{scope\_atten}$ Scope input impedance
$Z_{scope}$ The impedance of scope measurement cable
$\text{Loss}_{scope}$ Signal loss caused by scope measurement cable
$\text{Current}_{DUT}$ Current waveform through DUT
$R_{Fixture}$ Fixture leading resistance VCSEL Current Derivation In some embodiments, the following algorithm may be used to derive the actual VCSEL device current by using the acquired VCSEL waveform (i.e. the measured VCSEL device voltage) and compensation data (or information) obtained from the system compensation.

Single-Port Pulse Generation:

$$\text{Current}_{DUT} = \frac{(V_{scope\_OPEN} - V_{scope\_DUT}) \cdot (Z_{SF0} + Z_{scope}) \cdot (R_{scope\_atten} + Z_{scope})}{2 \cdot Z_{SF0} \cdot R_{scope\_atten} \cdot Z_{scope} \cdot \text{Loss}_{scope}}$$

Two-Port Pulse Generation:

$$\text{Current}_{DUT} = \\ \frac{(V_{scope\_OPEN} - V_{scope\_DUT}) \cdot (Z_{SF0} + Z_{scope} + Z_{SF1} \cdot Z_{scope} + Z_{SF0} \cdot Z_{SF1}) \cdot (R_{scope\_atten} + Z_{scope})}{2 \cdot Z_{SF0} \cdot Z_{SF1} \cdot R_{scope\_atten} \cdot Z_{scope} \cdot \text{Loss}_{scope}}$$

where $V_{scope\_DUT}$ VCSEL voltage waveform acquired by scope
$V_{scope\_OPEN}$ Voltage waveform acquired by scope under OPEN loading condition
$Z_{SF0}$ The impedance of the primary output cable
$Z_{SF1}$ The impedance of the secondary output cable
$Z_{scope}$ The impedance of the scope measurement cable
$\text{Loss}_{scope}$ Signal loss caused by the scope measurement cable
$R_{scope\_atten}$ Scope input impedance VCSEL Current-Setting As previously described above, a scaling relationship between the DUT current-setting and the SMU voltage-setting may be obtained through the pulse compensation procedure. To drive the desired amount of current, the SMU voltage value(s) may be interpolated from the known scaling relationship between the DUT current and the SMU voltage, and the pulse generator may be set to produce high-speed current pulses proportional to SMU voltage by using the interpolated voltage values for the SMU voltage.

Although the embodiments above have been described in considerable detail, other versions are possible. Numerous variations and modifications will become apparent to those skilled in the art once the above disclosure is fully appreciated. It is intended that the following claims be interpreted to embrace all such variations and modifications. Note the section headings used herein are for organizational purposes only and are not meant to limit the description provided herein or the claims attached hereto.

We claim:

1. A system for testing a vertical-cavity surface-emitting laser, VCSEL, device, the system comprising:
   a high-speed pulse generator configured to generate a nanosecond pulse based at least on a first subset of compensation data derived from the system, and provide the nanosecond pulse to the VCSEL device;
   a high-speed measurement instrument configured to measure a VCSEL device voltage developed across the VCSEL device in response to the nanosecond pulse; and
   a controller configured to obtain a VCSEL device current and a VCSEL device voltage based at least on the measured VCSEL device voltage and at least a second subset of the compensation data.

2. The system of claim 1, wherein the high-speed pulse generator and the high-speed measurement instrument are configured to couple to the VCSEL device in an open loop configuration.

3. The system of claim 1, further comprising:
   a bus, wherein the high-speed pulse generator and the high-speed measurement instrument are coupled to the bus, and wherein the controller is configured to control the high-speed pulse generator and the high-speed measurement instrument via the bus.

4. The system of claim 1, further comprising:
   an attenuator coupled across the VCSEL device and the high-speed measurement instrument, and configured to attenuate the VCSEL device voltage pulse to a specified input amplitude range of the high-speed measurement instrument.

5. The system of clam 1, wherein the compensation data comprises characteristics of one or more of:
   the high-speed pulse generator;
   the high-speed measurement instrument;
   one or more additional system components; or
   cabling used to connect the VC SEL device to the high-speed pulse generator and the high-speed measurement instrument.

6. The system of claim 1, wherein the compensation data comprises a scaling relationship between:
   an input voltage used for generating the nanosecond pulse; and
   the VCSEL device current.

7. The system of claim 1, wherein at least some of the compensation data is derived by measuring the nanosecond pulse under each one of different loading conditions of the high-speed pulse generator.

8. The system of claim 7, wherein the different loading conditions comprise:
   a first loading condition comprising output ports of the high-speed pulse generator remaining open;
   a second loading condition comprising output ports of the high-speed pulse generator shorted together; and
   a third loading condition comprising a representative device coupled across the output ports of the high-speed pulse generator.

9. The system of claim 8, wherein the controller is further configured to:
   obtain the VCSEL device current based at least on compensation data derived by measuring the nanosecond pulse under the first loading condition; and/or
   obtain the VCSEL device voltage based at least on compensation data derived by measuring the nanosecond pulse under the second loading condition.

10. A controller of a vertical-cavity surface-emitting laser, VCSEL, test system, the controller configured to perform operations comprising:
    generating, through a pulse generator, a nanosecond pulse based at least on compensation data derived from the VCSEL system, and providing the nanosecond pulse to a VCSEL device;
    measuring, through a measurement instrument, a VCSEL device voltage developed across the VCSEL device in response to the nanosecond pulse; and
    obtaining a VCSEL device current and a VCSEL device voltage based at least on the measured VCSEL device voltage and portions of the compensation data.

11. The controller of claim 10, wherein the pulse generator and the measurement instrument are coupled to the VCSEL device in an open loop configuration.

12. The controller of claim 10, the operations further comprising:
    controlling the pulse generator and the measurement instrument via a bus coupled to both the pulse generator and the measurement instrument.

13. The controller of claim 10, wherein the compensation data comprises characteristics of one or more of:
    the high-speed pulse generator;
    the high-speed measurement instrument;
    one or more additional system components;
    cabling used to connect the VC SEL device to the high-speed pulse generator and the high-speed measurement instrument; or
    a scaling relationship between:
       an input voltage used for generating the nanosecond pulse; and
       the VCSEL device current.

14. The controller of claim 10, the operations further comprising:
    deriving at least some of the compensation data by measuring the nanosecond pulse under each one of different loading conditions of the high-speed pulse generator.

15. The controller of claim 14, wherein the different loading conditions comprise:
    a first loading condition comprising output ports of the high-speed pulse generator remaining open;
    a second loading condition comprising output ports of the high-speed pulse generator shorted together; and
    a third loading condition comprising a representative device coupled across the output ports of the high-speed pulse generator.

16. The controller of 15, the operations further comprising:
    obtaining the VCSEL device current based at least on compensation data derived by measuring the nanosecond pulse under the first loading condition; and/or
    obtaining the VCSEL device voltage based at least on compensation data derived by measuring the nanosecond pulse under the second loading condition.

17. A non-transitory memory element storing programming instructions executable by a processor to cause, in a system for testing a vertical-cavity surface-emitting laser, VCSEL, device:
    a high-speed pulse generator to generate a nanosecond pulse based at least on a first subset of compensation data derived from the system, and provide the nanosecond pulse to the VCSEL device;
    a high-speed measurement instrument to measure a VCSEL device voltage developed across the VCSEL device in response to the nanosecond pulse; and a controller to obtain a VCSEL device current and a VCSEL device voltage based at least on the measured VCSEL device voltage and at least a second subset of the compensation data.

18. The non-transitory memory element of claim 17, wherein the compensation data comprises characteristics of one or more of:
- the high-speed pulse generator;
- the high-speed measurement instrument;
- one or more additional system components;
- cabling used to connect the VCSEL device to the high-speed pulse generator and the high-speed measurement instrument; or
- a scaling relationship between:
  - an input voltage used for generating the nanosecond pulse; and
  - the VCSEL device current.

19. The non-transitory memory element of claim 17, wherein the programming instructions are further executable to cause the controller to derive at least some of the compensation data by measuring the nanosecond pulse under each one of different loading conditions of the high-speed pulse generator; wherein the different loading conditions comprise:
- a first loading condition comprising output ports of the high-speed pulse generator remaining open;
- a second loading condition comprising output ports of the high-speed pulse generator shorted together; and
- a third loading condition comprising a representative device coupled across the output ports of the high-speed pulse generator.

20. The non-transitory memory element of claim 19, wherein the programming instructions are further executable to cause the controller to:
- obtain the VCSEL device current based at least on compensation data derived by measuring the nanosecond pulse under the first loading condition; and/or
- obtain the VCSEL device voltage based at least on compensation data derived by measuring the nanosecond pulse under the second loading condition.

* * * * *

UNITED STATES PATENT AND TRADEMARK OFFICE
CERTIFICATE OF CORRECTION

PATENT NO. : 11,959,945 B2
APPLICATION NO. : 17/761378
DATED : April 16, 2024
INVENTOR(S) : Jun Lu et al.

It is certified that error appears in the above-identified patent and that said Letters Patent is hereby corrected as shown below:

In the Claims

Claim 5, Column 17, Line 38, please delete "VC SEL" and add - VCSEL -.

Claim 13, Column 18, Line 27, please delete "VC SEL" and add - VCSEL -.

Claim 17, Column 19, Line 1, please delete "VC SEL" and add - VCSEL -.

Claim 17, Column 19, Lines 1 and 2, please delete "VC SEL" and add - VCSEL -.

Claim 18, Column 19, Line 11, please delete "VC SEL" and add - VCSEL -.

Signed and Sealed this
Twenty-eighth Day of May, 2024

Katherine Kelly Vidal
*Director of the United States Patent and Trademark Office*